United States Patent
Pan et al.

(10) Patent No.: US 8,772,089 B2
(45) Date of Patent: Jul. 8, 2014

(54) CHIP PACKAGE STRUCTURE AND MANUFACTURING METHOD THEREOF

(75) Inventors: Yu-Tang Pan, Hsinchu (TW); Shih-Wen Chou, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 250 days.

(21) Appl. No.: 13/479,297

(22) Filed: May 24, 2012

(65) Prior Publication Data

US 2013/0020688 A1 Jan. 24, 2013

(30) Foreign Application Priority Data

Jul. 20, 2011 (TW) .............................. 100125606 A

(51) Int. Cl.
- H01L 23/495 (2006.01)
- H01L 21/60 (2006.01)
- H01L 21/48 (2006.01)

(52) U.S. Cl.
CPC .... H01L 23/49558 (2013.01); H01L 23/49503 (2013.01); H01L 23/49548 (2013.01); H01L 21/4825 (2013.01)
USPC ........... 438/123; 438/112; 438/124; 257/671; 257/676

(58) Field of Classification Search
CPC ............ H01L 23/495; H01L 23/49503; H01L 23/4952; H01L 23/49541; H01L 23/49548; H01L 23/49568; H01L 21/4825
USPC .................... 257/671, 676; 438/112, 123, 124
See application file for complete search history.

(56) References Cited

U.S. PATENT DOCUMENTS

| | | | |
|---|---|---|---|
| 6,437,429 B1 * | 8/2002 | Su et al. | 257/666 |
| 6,448,633 B1 * | 9/2002 | Yee et al. | 257/666 |
| 6,545,332 B2 | 4/2003 | Huang | |
| 6,585,905 B1 * | 7/2003 | Fan et al. | 216/14 |
| 6,635,957 B2 * | 10/2003 | Kwan et al. | 257/691 |
| 6,756,660 B2 | 6/2004 | Yasunaga et al. | |
| 6,946,324 B1 * | 9/2005 | McLellan et al. | 438/111 |
| 7,226,811 B1 * | 6/2007 | McLellan et al. | 438/111 |

(Continued)

FOREIGN PATENT DOCUMENTS

| | | |
|---|---|---|
| CN | 101697348 | 4/2010 |
| CN | 102117752 | 7/2011 |

OTHER PUBLICATIONS

"Office Action of Taiwan counterpart application", issued on Oct. 25, 2013, p. 1-p. 5, in which the listed references were cited.

*Primary Examiner* — Evan Pert
(74) *Attorney, Agent, or Firm* — Jianq Chyun IP Office

(57) ABSTRACT

A chip package structure including a leadframe, a chip, bonding wires and an encapsulant is provided. The leadframe includes a die pad, leads and an insulating layer. The die pad includes a chip mounting portion and a periphery portion. At the periphery portion, the die pad has a second upper surface lying between a first upper surface and a lower surface of the die pad. Each lead includes a suspending portion and a terminal portion. The suspending portion connects to the terminal portion and extends from the terminal portion towards the die pad. The insulating layer is disposed on the second upper surface of the periphery portion and connects the suspending portions to the die pad. The chip is disposed on the chip mounting portion. The bonding wires electrically connect the chip to the suspending portions. The encapsulant covers the chip, the bonding wires, the insulating layer, and the leadframe.

12 Claims, 4 Drawing Sheets

(56) References Cited

U.S. PATENT DOCUMENTS

| | | | |
|---|---|---|---|
| 8,183,088 B2 * | 5/2012 | Jeon et al. | 438/106 |
| 8,367,479 B2 * | 2/2013 | Nakamura et al. | 438/123 |
| 8,551,820 B1 * | 10/2013 | Foster et al. | 438/123 |
| 8,664,752 B2 * | 3/2014 | Jeon et al. | 257/666 |
| 2003/0006055 A1 * | 1/2003 | Chien-Hung et al. | 174/52.1 |
| 2003/0042581 A1 * | 3/2003 | Fee et al. | 257/666 |
| 2006/0237831 A1 * | 10/2006 | Danno et al. | 257/678 |
| 2006/0255438 A1 * | 11/2006 | Omori et al. | 257/670 |
| 2007/0001278 A1 * | 1/2007 | Jeon et al. | 257/676 |
| 2007/0126092 A1 * | 6/2007 | San Antonio et al. | 257/674 |
| 2008/0029855 A1 * | 2/2008 | Chang | 257/666 |
| 2009/0032977 A1 * | 2/2009 | Yamaguchi | 257/787 |
| 2009/0039486 A1 * | 2/2009 | Shimazaki et al. | 257/676 |
| 2009/0200265 A1 * | 8/2009 | Chang | 216/39 |
| 2011/0003439 A1 * | 1/2011 | Yilmaz et al. | 438/124 |
| 2011/0183472 A1 * | 7/2011 | Lin et al. | 438/118 |
| 2012/0018860 A1 * | 1/2012 | Maniwa et al. | 257/666 |
| 2012/0306020 A1 * | 12/2012 | Shiraishi et al. | 257/368 |
| 2012/0306065 A1 * | 12/2012 | Bin Mohd Arshad | 257/676 |

* cited by examiner

CHIP PACKAGE STRUCTURE AND MANUFACTURING METHOD THEREOF

CROSS-REFERENCE TO RELATED APPLICATION

This application claims the priority benefit of Taiwan application serial no. 100125606, filed on Jul. 20, 2011. The entirety of the above-mentioned patent application is hereby incorporated by reference herein and made a part of this specification.

BACKGROUND OF THE INVENTION

1. Field of the Invention

The invention relates to a semiconductor package technique and more particularly to a chip package structure and a manufacturing method thereof.

2. Description of Related Art

Semiconductor package technique includes various package types. With the trend of miniaturization and thinning of chip package structures, the quad flat no-lead (QFN) package of the flat package type is developed. In the manufacturing process of the QFN package, a chip is first disposed on a die pad of a leadframe. A wire bonding process is then performed to electrically connect the chip to a plurality of leads of the leadframe through a plurality of bonding wires. Afterwards, the QFN package is completed by encapsulating the chip, the bonding wires, and the leadframe with an encapsulant.

Generally, each of the leads includes a suspending portion and the encapsulant fills the space underneath the suspending portions to establish a mold lock between the encapsulant and the leads, thereby preventing the encapsulant from peeling off from the leadframe. However, in the wire bonding process aforementioned, the suspending portions of the leads may sway or deform due to the downward force. As a consequence, the bonding wires cannot be firmly bonded to the leads effectively and are prone to peeling off from the leads, thereby leading to poor electrical connection or electrical failure. Moreover, in the encapsulating process, the suspending portions of the leads may shift easily due to the molding flow, which leads to bridging of the leads, and therefore an electrical short.

SUMMARY OF THE INVENTION

The invention is directed to a chip package structure having an insulating layer between a plurality of leads and a die pad configured to securely fix the leads.

The invention is further directed to a method of manufacturing a chip package structure. The method is capable of preventing a plurality of leads from swaying during a wire bonding process.

The invention is directed to a chip package structure including a leadframe, a chip, a plurality of bonding wires, and an encapsulant. The leadframe includes a die pad, a plurality of leads, and an insulating layer. The die pad has a first upper surface and a lower surface and includes a chip mounting portion and a periphery portion. The die pad has a second upper surface lying between the first upper surface and the lower surface of the die pad at the periphery portion. The leads are disposed around the die pad. The leads have a top surface and a first bottom surface, and each of the leads includes a suspending portion and a terminal portion. The leads have a second bottom surface lying between the top surface and the first bottom surface of the leads at the suspending portion. Each of the suspending portions connects to the terminal portion and extends from the terminal portion toward the die pad. The insulating layer is disposed on the second upper surface of the periphery portion and connects the suspending portions of the leads to the die pad. The chip is disposed on the chip mounting portion. The bonding wires electrically connect the chip to the suspending portions. The encapsulant covers the chip, the bonding wires, the insulating layer, and the leadframe.

According to the chip package structure in one embodiment of the invention, the insulating layer is further partially formed between the suspending portions of the adjacent leads.

According to the chip package structure in one embodiment of the invention, the insulating layer covers the periphery portion and a portion of the encapsulant.

According to the chip package structure in one embodiment of the invention, the second upper surface of the periphery portion and the second bottom surface of the suspending portions are coplanar.

According to the chip package structure in one embodiment of the invention, the second bottom surface of the suspending portions lies between the top surface of the leads and the second upper surface of the periphery portion.

According to the chip package structure in one embodiment of the invention, the encapsulant exposes a bottom surface of the terminal portions.

The invention is further directed to a method of manufacturing a chip package structure. In this method, a metal layer is first provided. The first upper surface of the metal layer is patterned to define a chip mounting portion and a plurality of lead portions. Here, the lead portions and the chip mounting portion have a gap therebetween. Next, an insulating layer is formed in the gap. The first lower surface of the metal layer is patterned to remove a portion of the metal layer below the lead portions and below the insulating layer, so as to form a plurality of leads and a die pad, wherein the die pad and the leads constitute a leadframe. The die pad has the chip mounting portion and a periphery portion. The die pad has a second upper surface lying between the first upper surface and the first lower surface of the metal layer at the periphery portion. Each of the leads has a suspending portion and a terminal portion. The lead has a second lower surface lying between the first upper surface and the first lower surface of the metal layer at the suspending portion. The suspending portion connects with the terminal portion and extends from the terminal portion toward the die pad. The insulating layer is disposed on the second upper surface of the periphery portion and connects the suspending portions of the leads to the die pad. A chip is disposed on the chip mounting portion and electrically connected to the suspending portions through a plurality of bonding wires. Afterwards, an encapsulant is formed to cover the chip, the bonding wires, the insulating layer, and the leadframe.

According to the method of manufacturing the chip package structure in one embodiment of the invention, the insulating layer is further partially formed between the suspending portions of the adjacent leads.

According to the method of manufacturing the chip package structure in one embodiment of the invention, the insulating layer covers the periphery portion and a portion of the encapsulant.

According to the method of manufacturing the chip package structure in one embodiment of the invention, the second upper surface of the periphery portion and the second bottom surface of the suspending portions are coplanar.

According to the method of manufacturing the chip package structure in one embodiment of the invention, the second lower surface of the suspending portions lies between the first upper surface of the metal layer and the second upper surface of the periphery portion.

According to the method of manufacturing the chip package structure in one embodiment of the invention, the encapsulant exposes a bottom surface of the terminal portions.

In light of the foregoing, the insulating layer is formed between the suspending portions of the leads and the die pad in the invention, so that the suspending portions are fixed to the periphery portion of the die pad through the insulating layer. Consequently, poor bonding and lead deformation due to swaying of the suspension portions of the leads caused by the downward wire bonding force can be prevented. Furthermore, shifting of the suspending portions of the leads caused by the molding flow can also be avoided in the encapsulating process.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1A:
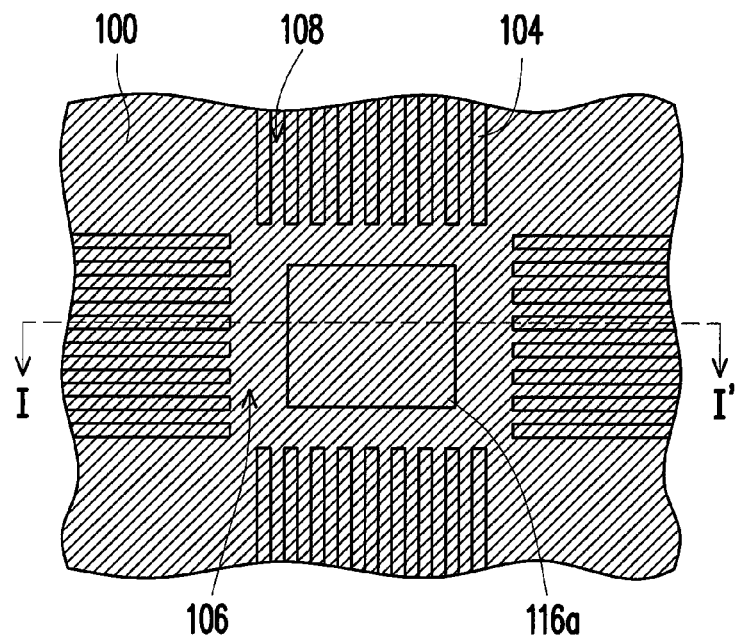
FIGS. 1A to 1D are schematic top views illustrating a method of manufacturing a chip package structure according to an embodiment of the invention.

FIGS. 1A to 1D are schematic top views illustrating a method of manufacturing a chip package structure according to an embodiment of the invention. FIGS. 2A to 2D are schematic cross-sectional diagrams taken along lines I-I' in FIGS. 1A to 1D respectively. Referring to both FIGS. 1A and 2A, a metal layer 100 is provided. The metal layer 100 has a first upper surface 100a and a first lower surface 100b opposite to the first upper surface 100a. The metal layer 100 is, for example, a copper foil base which can be used to manufacture a plurality of leadframes. In the present embodiment, only one leadframe is illustrated. The first upper surface 100a of the metal layer 100 is patterned to define a chip mounting portion 116a and a plurality of lead portions 104, where the lead portions 104 and the chip mounting portion 116a have a gap 106 therebetween, and the adjacent lead portions 104 have a gap 108 therebetween. In the present embodiment, the step of patterning the first upper surface 100a of the metal layer 100 can for example be performed by an etching process to partially remove an upper portion of the metal layer 100 for forming a protrusion structure which includes the chip mounting portion 116a and the lead portions 104.

Figure 1B:
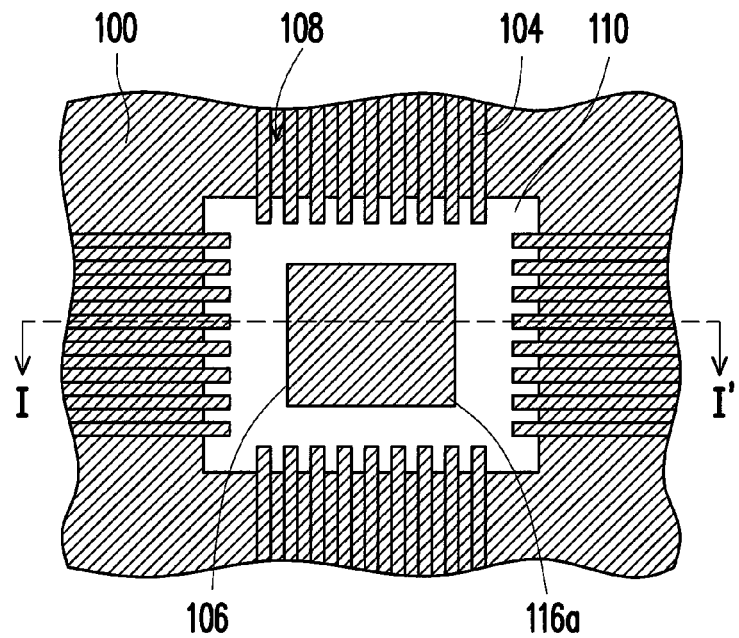
Figure 2A:
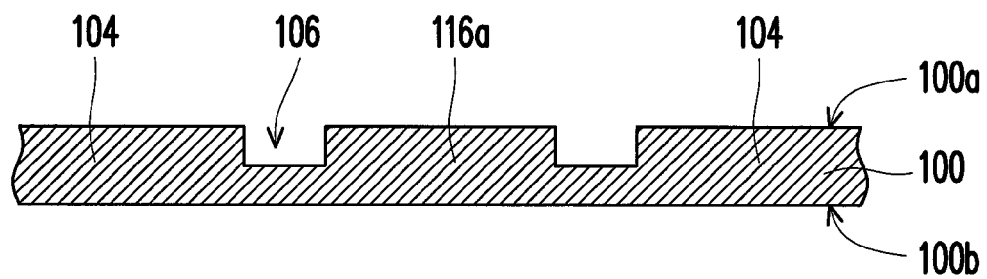
FIGS. 2A to 2D are schematic cross-sectional diagrams taken along lines I-I' in FIGS. 1A to 1D respectively.
Figure 2B:
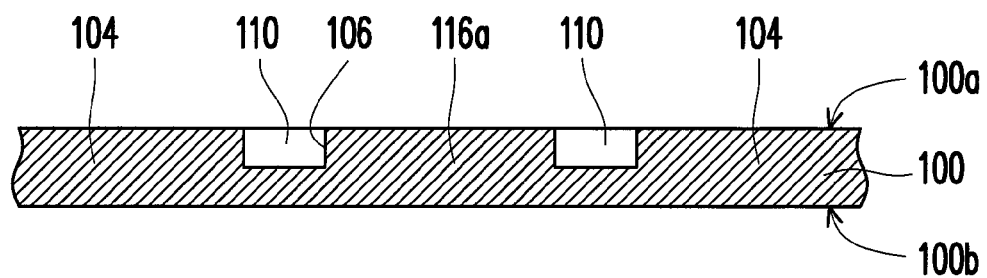

Referring to FIGS. 1B and 2B, an insulating layer 110 is formed in the gap 106. The step of forming the insulating layer 110 can be done for example by coating an insulating material in the gap 106 and then curing the insulating material. In addition, in the process of coating the insulating material, a portion of the insulating material may also be coated in the gap 108 between the adjacent lead portions 104, so that the insulating layer 110 is also formed in a region of the gap 108 near the chip mounting portion 116a. The insulating material aforementioned can be selected from polyimide (PI), solder resist/mask, benzocyclobutene (BCB), or other similar materials.

Figure 1C:
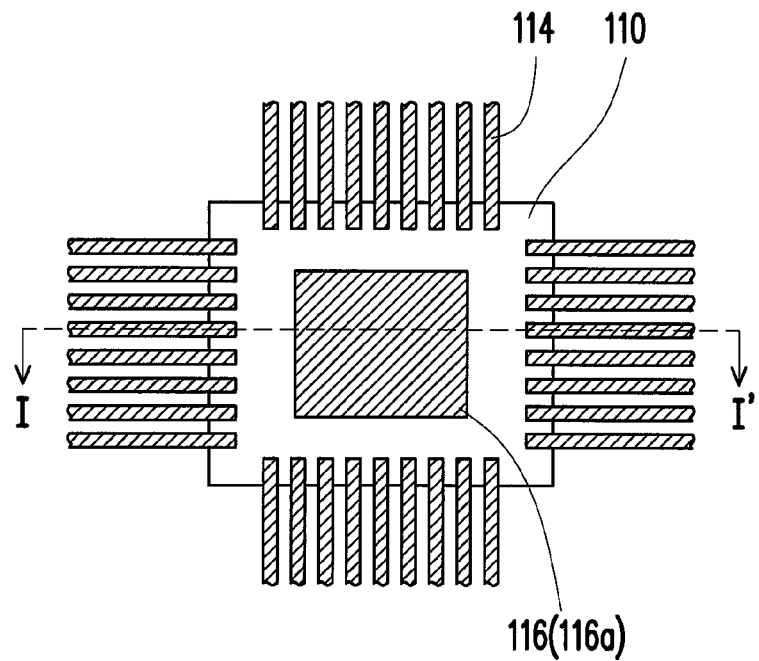
Figure 2C:
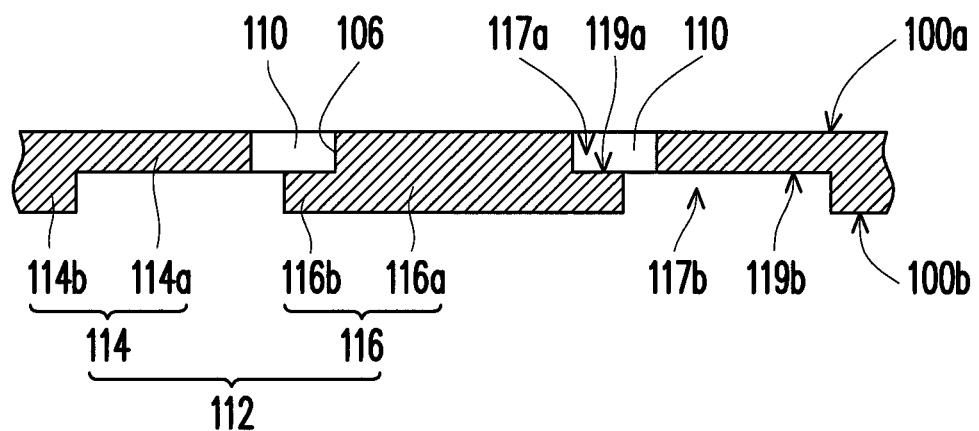

Referring to FIGS. 1C and 2C, the first lower surface 100b of the metal layer 100 is patterned to remove a portion of the metal layer 100 below the lead portions 104 and below the insulating layer 110, so as to define a plurality of leads 114 and a die pad 116 which constitute a leadframe 112. The leads 114 are disposed around the die pad 116. In the present embodiment, the step of patterning the first lower surface 100b of the metal layer 100 can for example be performed by an etching process to partially remove a lower portion of the metal layer 100. Specifically, the lower portion of the metal layer 100 below the insulating layer 110 and the lead portions 104 is removed with a half-etching method until the insulating layer 110 is exposed. After the first lower surface 100b of the metal layer 100 is patterned, each of the leads 114 then has a suspending portion 114a and a terminal portion 114b. The suspending portion 114a is a portion to connect with a bonding wire in a subsequent wire bonding process. The terminal portion 114b is a portion for the finished chip package structure to electrically connect to an external device. Other than the chip mounting portion 116a, the die pad 116 also includes a periphery portion 116b. The chip mounting portion 116a is a portion for a chip to be disposed thereon in a subsequent chip bonding process.

In details, after the first lower surface 100b of the metal layer 100 is patterned, a first recess portion 117a is formed on an upper end of the die pad 116 at the periphery portion 116b, such that a thickness of the chip mounting portion 116a is larger than a thickness of the periphery portion 116b. Moreover, a second recess portion 117b is formed on a lower end of the lead 114 at the suspending portion 114a, so that a thickness of the terminal portion 114b is larger than a thickness of the suspending portion 114a. More specifically, the first recess portion 117a renders the die pad 116 to have a second upper surface 119a lying between the first upper surface 100a and the first lower surface 100b of the metal layer 100 at the periphery portion 116b. The second recess portion 117b renders the lead 114 to have a second lower surface 119b lying between the first upper surface 100a and the first lower surface 100b at the suspending portion 114a. Moreover, the suspending portion 114a connects to the terminal portion 114b and extends from the terminal portion 114b toward the die pad 116. The insulating layer 110 is located between the suspending portions 114a of the leads 114 and the chip mounting portion 116a of the die pad 116, and disposed on the second upper surface 119a at the periphery portion 116b. Accordingly, the suspending portions 114a of the leads 114 can be fixed to the periphery portion 116b of the die pad 116 through the insulating layer 110. Furthermore, since the insulating layer 110 is also disposed between the adjacent suspending portions 114a, the suspending portions 114a can be effectively prevented from swaying, deforming, or shifting caused by external force in the subsequent process.

In the present embodiment, after the first lower surface 100b of the metal layer 100 is patterned, a top surface of the leads 114 formed and an upper surface of the chip mounting portion 116a of the die pad 116 formed are portions of the first upper surface 100a of the metal layer 100, and a bottom surface of the terminal portions 114b of the leads 114 is a portion of the first lower surface 100b of the metal layer 100. The top surface of the leads 114, the upper surface of the chip mounting portion 116a, and the upper surface of the insulating layer 110 are coplanar. The second upper surface 119a of the periphery portion 116b and the second lower surface 119b of the suspending portions 114a are coplanar. In other embodiments, the second lower surface 119b of the suspending portions 114a can lie between the first upper surface 100a of the metal layer 100 and the second upper surface 119a of the periphery portion 116b.

Figure 1D:
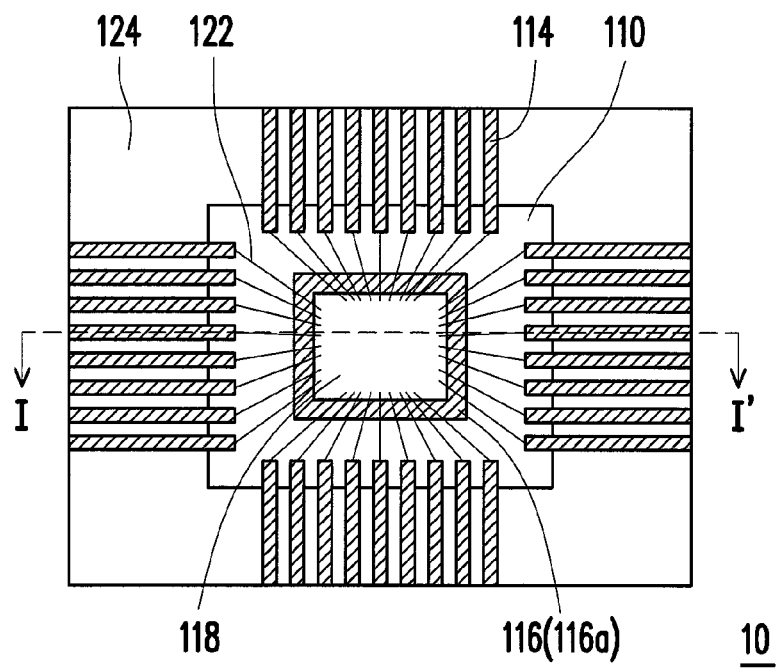
Figure 2D:
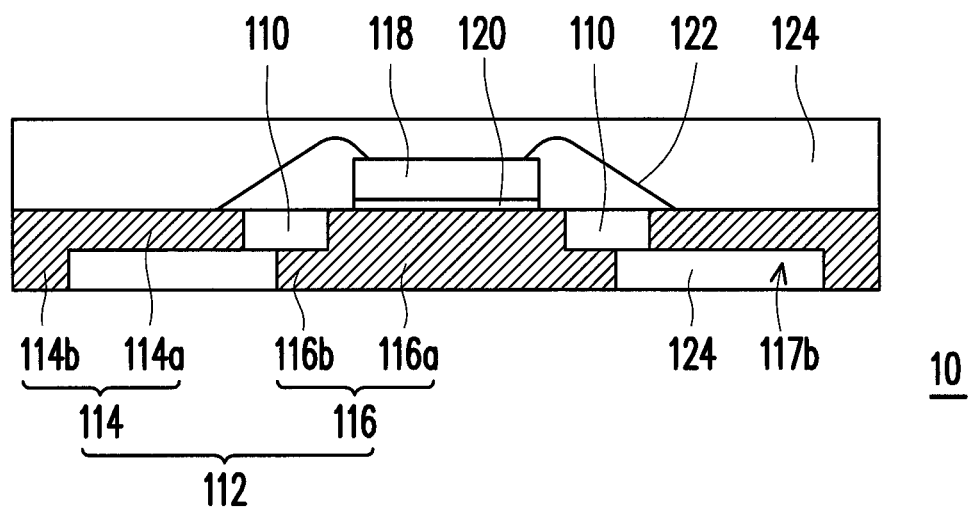

Referring to FIGS. 1D and 2D, a chip 118 is disposed on the chip mounting portion 116a. An adhesive layer 120 is first formed on the chip mounting portion 116a or a back side of the chip 118 before the chip 118 is disposed on the chip mounting portion 116a so as to stably mount the chip 118 on the chip mounting portion 116a. Thereafter, a wire bonding process is performed to form a plurality of bonding wires 122 for electrically connecting the chip 118 to the suspending portions 114a respectively. Since the suspending portions 114a have been fixed to the periphery portion 116b of the die pad 116 through the insulating layer 110 before the wire bonding process, the sway or deformation of the suspending portions 114a caused by the downward force exerted during wire bonding process can be prevented, and the bonding wires 122 can be bonded to the leads 114 tightly without peeling off. Moreover, in the present embodiment, since the insulating layer 110 is also formed between adjacent suspending portions 114a, the sway, deformation, or shift of the suspending portions 114a in the wire bonding process or the subsequent encapsulating process can thus be prevented effectively.

Referring to FIGS. 1D and 2D, after forming the bonding wires 122, an encapsulant 124 is formed to cover the chip 118, the bonding wires 122, the insulating layer 110, and the leadframe 112. The encapsulant 124 also fills in the second recess portions 117b of the leads 114, such that the encapsulant 124 can be locked to the leadframe 112 more securely. Afterwards, since the metal layer 100 substantially comprises a plurality of leadframes 112, a singulation process is further performed to form a plurality of individual chip package structures 10. In the present embodiment, the insulating layer 110 covers the periphery portion 116b and a portion of the encapsulant 124. The encapsulant 124 exposes the bottom surfaces of the terminal portions 114b of the leads 114 and the die pad 116 so that the chip package structure 10 can electrically connect to an external device such as a printing circuit board through the exposed bottom surfaces of the terminal portions 114b and have heat dissipated via the exposed bottom surface of the die pad 116. In other embodiments, the encapsulant 124 may cover the bottom surface of the die pad 116 without exposing it.

It will be apparent to those skilled in the art that various modifications and variations can be made to the structure of the disclosed embodiments without departing from the scope or spirit of the invention. In view of the foregoing, it is intended that the invention cover modifications and variations of this invention, provided they fall within the scope of the following claims and their equivalents.

What is claimed is:

1. A chip package structure, comprising:
    a leadframe, comprising:
        a die pad, having a first upper surface and a lower surface and comprising a chip mounting portion and a periphery portion, the die pad having a second upper surface lying between the first upper surface and the lower surface at the periphery portion;
        a plurality of leads, disposed around the die pad and having a top surface and a first bottom surface and each including a suspending portion and a terminal portion, wherein the leads have a second bottom surface lying between the top surface and the first bottom surface at the suspending portion, and each of the suspending portions connects to the terminal portion and extends from the terminal portion toward the die pad; and
        an insulating layer, disposed on the second upper surface of the periphery portion and connecting the suspending portions of the leads to the die pad;
    a chip, disposed on the chip mounting portion;
    a plurality of bonding wires, electrically connecting the chip to the suspending portions; and
    an encapsulant, covering the chip, the bonding wires, the insulating layer, and the leadframe.

2. The chip package structure as claimed in claim 1, wherein the insulating layer is further partially formed between the suspending portions of the adjacent leads.

3. The chip package structure as claimed in claim 1, wherein the insulating layer covers the periphery portion and a portion of the encapsulant.

4. The chip package structure as claimed in claim 1, wherein the second upper surface of the periphery portion and the second bottom surface of the suspending portions are coplanar.

5. The chip package structure as claimed in claim 1, wherein the second bottom surface of the suspending portions lies between the top surface of the leads and the second upper surface of the periphery portion.

6. The chip package structure as claimed in claim 1, wherein the encapsulant exposes a bottom surface of the terminal portions.

7. A method of manufacturing a chip package structure, comprising the steps of:
    providing a metal layer having a first upper surface and a first lower surface;
    patterning the first upper surface of the metal layer to define a chip mounting portion and a plurality of lead portions, wherein the lead portions and the chip mounting portion have a gap therebetween;
    forming an insulating layer in the gap;
    patterning the first lower surface of the metal layer to remove a portion of the metal layer below the lead portions and below the insulating layer, so as to form a plurality of leads and a die pad, the die pad and the leads constituting a leadframe, wherein the die pad has the chip mounting portion and a periphery portion, the die pad has a second upper surface lying between the first upper surface and the first lower surface of the metal layer at the periphery portion, each of the leads has a suspending portion and a terminal portion, the lead has a second lower surface lying between the first upper surface and the first lower surface of the metal layer at the suspending portion, the suspending portion connects with the terminal portion and extends from the terminal portion toward the die pad, the insulating layer is disposed on the second upper surface of the periphery portion and connects the suspending portions to the die pad;
    mounting a chip on the chip mounting portion and electrically connecting the chip to the suspending portions through a plurality of bonding wires; and
    forming an encapsulant to cover the chip, the bonding wires, the insulating layer, and the leadframe.

8. The method of manufacturing the chip package structure as claimed in claim 7, wherein the insulating layer is further partially formed between the suspending portions of the adjacent leads.

9. The method of manufacturing the chip package structure as claimed in claim 7, wherein the insulating layer covers the periphery portion and a portion of the encapsulant.

10. The method of manufacturing the chip package structure as claimed in claim 7, wherein the second upper surface of the periphery portion and the second lower surface of the suspending portions are coplanar.

11. The method of manufacturing the chip package structure as claimed in claim 7, wherein the second lower surface of the suspending portions lies between the first upper surface of the metal layer and the second upper surface of the periphery portion.

12. The method of manufacturing the chip package structure as claimed in claim 7, wherein the encapsulant exposes a bottom surface of the terminal portions.

* * * * *